(12) United States Patent
Ringe et al.

(10) Patent No.: US 8,037,441 B2
(45) Date of Patent: Oct. 11, 2011

(54) GRIDDED-ROUTER BASED WIRING ON A NON-GRIDDED LIBRARY

(75) Inventors: Matthias Ringe, Bonn (DE); Karsten Muuss, Niederkassel (DE)

(73) Assignee: International Business Machines Corporation, Armonk, NY (US)

( * ) Notice: Subject to any disclaimer, the term of this patent is extended or adjusted under 35 U.S.C. 154(b) by 518 days.

(21) Appl. No.: 12/237,497

(22) Filed: Sep. 25, 2008

(65) Prior Publication Data

US 2009/0083689 A1    Mar. 26, 2009

(51) Int. Cl.
*G06F 17/50*    (2006.01)
(52) U.S. Cl. .................. 716/119; 716/122; 716/126
(58) Field of Classification Search .............. 716/119, 716/122, 126
See application file for complete search history.

(56) References Cited

U.S. PATENT DOCUMENTS

| | | | |
|---|---|---|---|
| 6,338,972 B1* | 1/2002 | Sudhindranath et al. ....... 438/14 |
| 7,739,644 B1* | 6/2010 | Chong et al. .................. 716/119 |
| 2002/0042904 A1* | 4/2002 | Ito et al. ...................... 716/8 |
| 2003/0023938 A1* | 1/2003 | Nagasaka et al. ............. 716/2 |
| 2006/0059448 A1* | 3/2006 | Meyhoefer et al. ........... 716/10 |
| 2006/0136848 A1* | 6/2006 | Ichiryu et al. ................ 716/1 |
| 2006/0294488 A1* | 12/2006 | Waller ........................... 716/13 |
| 2007/0143724 A1* | 6/2007 | Alpert et al. ................... 716/10 |
| 2007/0204252 A1* | 8/2007 | Furnish et al. ................. 716/10 |
| 2007/0240088 A1* | 10/2007 | Tang et al. ..................... 716/9 |
| 2008/0127017 A1* | 5/2008 | Alpert et al. ................... 716/10 |
| 2010/0077374 A1* | 3/2010 | Qiu ................................ 716/17 |

OTHER PUBLICATIONS

"Routing Requirements for the Nanometer Era"—White Paper of Cadence Design Systems, Inc., San Jose, CA, USA published in 2004.

* cited by examiner

*Primary Examiner* — Jack Chiang
*Assistant Examiner* — Magid Dimyan
(74) *Attorney, Agent, or Firm* — H. Daniel Schnurmann

(57) ABSTRACT

A computerized method for automatically generating a grid-based derivative of a non-gridded cell library of an integrated circuit design comprises the step of determining at least one valid position of at least one wiring element of a circuit of the first cell library, wherein the at least one valid position fulfills all technological design rules and wherein the at least one valid position fits into the second grid format. The method can also be used for automatically transforming a first cell library of an integrated circuit design having a first grid format into a second cell library having a second grid format or for automatically analyzing a grid-based cell library of an integrated circuit design in view of the circuit quality regarding technical design rules.

16 Claims, 5 Drawing Sheets

GRIDDED-ROUTER BASED WIRING ON A NON-GRIDDED LIBRARY

BACKGROUND OF THE INVENTION

1. Field of the Invention

This invention relates generally to the field of integrated circuit design technology and more specifically to methodologies for routing the interconnections between components of an integrated circuit.

2. Background

Microelectronic integrated circuits (ICs) consist of a large number of electronic components that are fabricated by layering several different materials on a silicon base or wafer. The physical design of an IC transforms an abstract circuit description into a geometric description, which is known as "layout" and which consists of a set of planar geometric shapes in several layers. The objective of physical design is to determine an optimal arrangement of devices in a plane or in a three dimensional space, and an efficient interconnection or routing scheme between the devices to obtain the desired functionality. Since space on a wafer is very expensive real estate, algorithms must use the space very efficiently to lower costs and improve yield.

The physical design of a microelectronic IC commonly is an automated optimization process using digital computers and specialized Computer Aided Design (CAD) tools. Automation of the physical design process has increased the level of integration, reduced turn-around time and enhanced chip performance.

A generated layout has to be checked to ensure that it meets all of the design requirements. The result of this check is a set of design files in a particular unambiguous representation known as an intermediate form that describes the layout. The design files are then converted into pattern generator files that are used to produce patterns called "masks" by an optical or electron beam pattern generator.

For the physical design of ICs, prefabricated elements are used that provide combinatorial or storage functions. These elements are called cells (or types). A collection of different cells forms a library. The usage of a cell in a design is referred to as instance or circuit. If most of cells have the same height and connect their power through abutted placement in circuit row, the cells are called standard cells and the design style standard cell layout.

A particular design element of an IC is a so-called "pin" which refers to a physical or logical access terminal to a cell and circuit. An example for a pin is an inverter having one input and one output pin.

The mentioned instances of an IC are interconnected or routed in accordance with the logical design of the circuit to provide the desired functionality. Hereby the various elements of the circuit are interconnected by electrically conductive lines or traces that are routed through vertical channels and horizontal channels that run between the cells.

The whole design process consists of the following three design phases namely Partitioning, Floor planning and placement, and Routing:

1. Partitioning—A chip may contain several million transistors and therefore the layout of the entire circuit cannot be handled in a reasonable amount of time using the currently available computation power. Therefore the layout is partitioned by grouping components into blocks such as sub circuits and modules. The output of partitioning is a set of blocks, along with the interconnections required between blocks. The set of interconnections and connected objects is referred to as a "netlist".

2. Floor planning and placement—This step is concerned with selecting good layout alternatives for each block of the entire chip, as well as between blocks and to the edges. Floor planning is a critical step as it sets up the ground work for a good layout. During placement, the blocks are exactly positioned on the chip. The goal of placement is to find a minimum area arrangement for the blocks that allows completion of interconnections between the blocks in such a way that they obey technology constraints. The placement must be legal, i.e. have no overlaps and must meet e.g. technology constraints.

Placement is typically done in two phases. In the first phase, an initial placement is created. In the second phase, the initial placement is evaluated and iterative improvements are made until the layout has minimum area and conforms to design specifications.

3. Routing—The goal of a router is to complete all circuit connections while trying to use the shortest possible wire length. Routing is usually done in two phases referred to as "global routing" and "detailed routing" phases.

During the global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

After the global routing, the global wires have to be legalized, namely by connecting them to off-grid contact pins and maybe by moving the global wires around off-grid areas that have to be blocked to prevent not allowed short circuits or other not allowed electrical connections of the underlying circuit layout (so-called "blocking areas"). However, this legalization step is rather complex and thus computationally extensive.

In addition, IC chips typically have several metal layers upon which the wires are routed with the horizontal wires routed on different layers than the vertical wires. An electrical connection between two nets on adjacent layers is implemented using a so-called "via" which is an etched hole in a substrate's oxide for allowing a conductive path to extend from one layer to another layer of the underlying IC chip, that can be used e.g. for conducting power (so-called "power via") or even signals. The routing program must therefore produce a list of horizontal and vertical segments for each net, connected by the mentioned vias, all of which have to be conformal with the underlying technology requirements, also known as 'ground rules', for wire spacing and wire capacity.

Since the placement process may produce a non-routable layout, the chip might need to be replaced or re-partitioned before another routing is attempted. The whole design cycle is conventionally repeated several times to accomplish the design objectives. The complexity of each step varies depending on the design constraints as well as the design style used.

For the above mentioned wiring (i.e. designing the electrical connections between the blocks) it is well-known to utilize so-called 'Gridded Routers'. The basic aspects of grid-based routing are described in a white paper of Cadence Design Systems, Inc., San Jose, Calif., USA published in 2004 and entitled "Routing Requirements for the Nanometer Era".

Grid-based routers superimpose a virtual 'mesh'-like template (the so-called "routing grid" or "wiring grid") over the routing area of the design with evenly spaced tracks, or grids, running both vertically and horizontally across the design area. Every vertical and horizontal grid intersection point on the mesh is maintained as a pointer in the memory of an underlying computer, and any routing operation that is performed must be cognizant of all the grid points in the design as a whole and aware of any trade-offs, timing, congestion, design rule check (DRC), etc. involved with the specific operation before completing it. Most of the presently known routers are grid-based and only the pin-access is usually non-gridded. The reason is that a true gridless router would need a nearly infinite search space for possible wiring lines thus revealing huge run times even with small designs. On the other hand, in the case of grid-based routers, the larger the design grows or the smaller the process geometry or space between grid points becomes, the more grid points are needed to be allocated in memory, and therefore, the more time it will take for a gridded router to perform any task.

Further to the above mentioned white paper, in an article entitled "Routing for Complex SoC Designs" and being published by Synopsys, Inc., in 1999, the above described design planning and routing, including the mentioned floor planning, is disclosed in greater detail. This article, on page 5, includes a comparison of grid-based and non-grid-based routing algorithms.

In particular, in the field of Very Large-Scale Integrated (VLSI) circuit designs, in the past, the above mentioned gridded routers have been applied to circuit structures which are a multiple of a uniform grid and insofar fit into or match with the router's grid. However, recently developed chip technologies like the known Cu based 65 nm process technology require that only ground rules have to be considered. As a consequence, structures like contact pins or the above mentioned blocked or blocking areas are 'gridless' data and thus cannot be aligned with a simple routing grid. In addition, the grids for the above described placement and routing processes comprise differing offsets, i.e. these grids cannot be aligned with each other.

There exist prior art approaches (see above two citations) according to which the routing is accomplished on a gridless basis wherein interconnections are constructed without any geometrical restrictions. However, this gridless routing does not have the above described algorithmic advantages and is by a factor 4 slower than a grid-based approach.

Furthermore, the above described legalization step that is executed after the global routing, requires a computer-extensive calculation of the pin access of the contact pins and has to be executed for each single pin.

Although gridded routers are known for their relatively high speed, they lack the flexibility required for the above mentioned complex VLSI designs.

Another drawback of the grid-based routers (see above mentioned Cadence White Paper, Sec. 6.1.1) is that the position of the pre-described vias disadvantageously has to be fixed prior to the routing.

OBJECTIVE OF THE INVENTION

The invention is based on the objective to provide an integrated circuit routing methodology that enables a gridded wiring based on non-gridded circuit information, in particular a non-gridded circuit library.

This objective always comes up when a chip manufacturer wants to use existing libraries of standard cells of a concrete CMOS technology or similar technologies.

SUMMARY AND ADVANTAGES OF THE INVENTION

The objectives of the invention are solved by the features of the independent claims. Further advantageous arrangements and embodiments of the invention are set forth in the respective subclaims.

According to a first aspect of the present invention, at least one existing non-gridded library of standard cells is transformed or translated into a grid-based copy or derivative of the non-gridded cell library. This grid-based copy or derivative can be used by a gridded routing process or gridded router with the above mentioned advantages.

According to a second aspect, for the transformation or translation of a non-gridded cell library into a gridded copy or derivative thereof, legal positions of pins are determined wherein these legal positions are those positions which fulfill all technical design rules, e.g. these positions do not result in a short circuit or the like. These positions in addition have to fit into or match with a routing grid used by the router.

It is emphasized that the finding of a legal position in both the x- and y-direction, which even fits into a given grid structure, is rather difficult to achieve.

According to a further aspect, the above described determination or optimization of off-grid pin access wiring data is done in advance, i.e. prior to the following grid-based routing process. As a result, the above mentioned advantages of a grid-based routing are still provided.

According to a further aspect, an on-grid pin location can be located on a different layer, if beneficial. In this case, a legal position for the required via can be determined using the methodology according to the present invention.

According to another aspect of the present invention, even in cases where a legal position of a pin cannot be found at all, the legal validity and suitability of a combination of a book and related offset value can be determined based on a cost function.

According to still another aspect, the methodology of the present invention can also be used to analyze a non-gridded cell library in view of the possibility to find legal interconnections at all for a grid-based copy or derivative thereof in order to get corresponding quality-related information of a grid-based version of the library.

According to still another aspect, in cases where one or more cells cannot be interconnected at all, the present invention provides even an approach to overcome such problems.

According to yet another aspect of the invention, a method is provided for designing an integrated circuit, the method comprising:
  providing a circuit description;
  providing a plurality of cells comprising pre-determined circuit parts, each cell having at least one circuit pin for providing electrical connection from the cell to a wiring element;
  forming a placement layout of cells from said plurality of cells that represents said circuit description and satisfies pre-determined technological design rules, wherein each cell within the placement layout comprises a pin region within which said at least one circuit pin may be legally connected to a wiring element according to said technological design rules;
  providing a routing grid for designing routing paths of interconnections between cells;
  identifying an offending cell of said plurality of cells within said placement layout wherein said pin region of said offending cell does not legally align with a location on said routing grid; and
  prior to performing a routing of interconnections between cells in said placement layout, moving the location of said offending cell so that said pin region of said offending cell is legally aligned with said routing grid while continuing to satisfy said technological design rules.

Additional aspects of the invention will be set forth in part in the description which follows, and in part will be obvious from the description, or may be learned by practice of the invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

Skilled artisans will observe that elements in the figures are illustrated for simplicity and clarity and have not necessarily been drawn to scale. For example, the dimensions of some of the elements in the figures are exaggerated relative to other elements to help to ease understanding of embodiments of the present invention.

DETAILED DESCRIPTION

A typical integrated circuit (IC) design flow uses so-called "standard cells" as basis for building circuits. Such standard cells are pre-designed circuit parts that the CAD tools use to assemble larger circuits. A standard cell is understood to be a specific logic function generally associated with a larger standard cell library having many (e.g. several hundred) individual standard cells which are ground rule compliant themselves. The cell-based design relies on a building-block infrastructure based on standard libraries of such cells. Suitable sets of such digital cell libraries contain several hundreds of cells.

Figure 1:
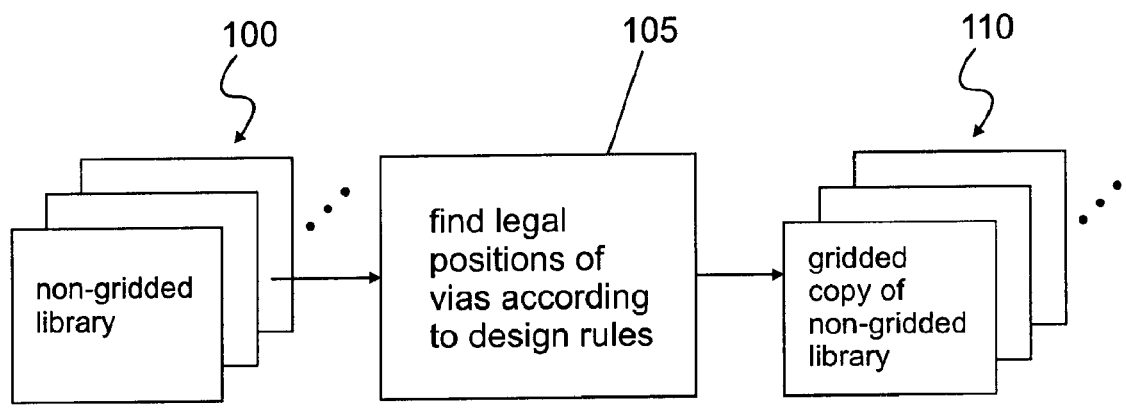
FIG. 1 an illustration of the basic principle of the present invention.

Such a library is depicted in FIG. 1 by reference numeral 100 and shall be a non-gridded version, as described beforehand.

As known in the art, a cell-based IC is formed by selecting a plurality of cells that represent components having different characteristics from one or more cell libraries, determining interconnects for the selected cells, and then placing and routing the interconnected selected cells to form the IC. For instance, groups of cells may be interconnected to function as flip-flops, shift registers and the like.

The above design process is conventionally described in terms of logic description, synthesis of that logic, and then placement and routing of the synthesized logic.

The end result of the logic design is a netlist providing interconnections to boxes representing logic elements selected from a library. Upon completion of the logic design, a physical design process must then be performed to translate the abstract logic design into its physical realization on the chip. The physical design process consists of placing boxes wherein physical realizations of the library cells are used to place the boxes on a chip image.

Every circuit has a set of constraints it must meet like timing constraints which specify when clock and other signals actually arrive and when they are required to arrive. Additional constraints include electrical constraints which limit the amount of capacitance on any net and the maximum amount of slew time that can be tolerated. Finally there are other technology rules that constrain the design, for instance that places boxes must not overlap. A design is considered to be legal if it meets all the design constraints.

It is the task of routing (also referred to as "wiring") to arrange the wires on the chip image so that connections among the pins match the logical connections. Electrical connections of individual components on ICs are established using conducting paths (called "wires" or "nets") between terminals of components which are to be connected. Automatic routing schemes are used to determine these conducting paths.

IC chips typically have several metal layers commonly designated at M1, M2, M3, etc. upon which the wires are routed with the horizontal wires routed on different layers than the vertical wires. As described beforehand, electrical connection between two nets on adjacent layers is implemented with "vias". The underlying routing process must therefore produce a list of horizontal and vertical segments for each net, connected by vias, all of which conform to the technology requirements for wire spacing and wire capacity.

In most cases, the wiring process is executed after the chip placement and thus the wire end points, also commonly known as 'terminals', are known and fixed. Using physical design algorithms as discussed above, each cell placement is conventionally represented in the form of a list or table including locations on the chip and identifiers of the cells that are assigned to the respective locations. Routing processes therefore attempt to completely route the wires among the end points to avoid congestion. However, in some instances, wiring may be performed concurrently with placement, particularly since the placements in the design can to some extent avoid wiring congestion.

For more complex designs like the above mentioned VLSI designs, there are typically at least four distinct layers of conducting medium available for routing, such as a poly-silicon layer P1 and three metal layers M1-M3. These at least four layers are all used for vertical and/or horizontal routing. Hereby it is common practice to route each conducting path by using one or more of the distinct layers M1-M3 and P1, with one layer of a pair being reserved predominantly for connections running along the "x" direction and the other layer for connections running in the orthogonal or "y" direction. Some of the layers, such as the metal layers M1-M3, are exclusively used for interconnection of components wherein the poly-silicon layer P1 may have a dual role, such as forming the gates of transistors as well as for interconnection of components.

Turning now back to FIG. 1, the wiring for forming the standard cells that provide the various functions using a gate array (e.g. a CMOS gate array) is designed in advance and prepared in the form of the mentioned library 100. The designer combines the appropriate standard cells with reference to the library 100 and designs the wiring between these cells.

As already mentioned, the library 100 is either a non-gridded one i.e. the circuit elements and included wiring included in the standard cells of the library 100 are designed without using a grid, or the offset of the underlying grid (so-called placement grid) is assumed to be different from the offset of the routing grid later used in the grid-based router. The mentioned circuit elements, in other words, are not aligned with the lines of a grid.

In order to allow the use of such a non-gridded library 100 in a grid-based router, the non-gridded library according to the present invention is modified, preferably transformed or translated, in advance, i.e. prior to the use in the grid-based router, to a gridded copy or derivate 110 thereof. This transformation is mainly based on a procedure 105 by which legal positions of particularly the mentioned vias are determined based on given design rules. An example of such a design rule is the avoidance of a short circuit, e.g. caused by a via between two metal layers like M1 and M2 or M2 and M3.

As a result, the modified library 110 can be used in a grid-based router. The transformation of the library from the non-gridded one 100 to the gridded one 110, based on the inventive method described in the following in more detail, can be advantageously performed in a relatively short time of about and in even less than 1 min.

As mentioned hereinbefore, gridded routers divide the routing area in a uniform grid for every metal layer. As an example, FIG. 2A and FIG. 2B depict a schematic top view of such a routing (wiring) grid 200 that is drawn in this and the following FIGURES using dashed lines, not at least due to the fact that this grid is only a virtually applied template as mentioned beforehand.

Figures 2A, 2B:
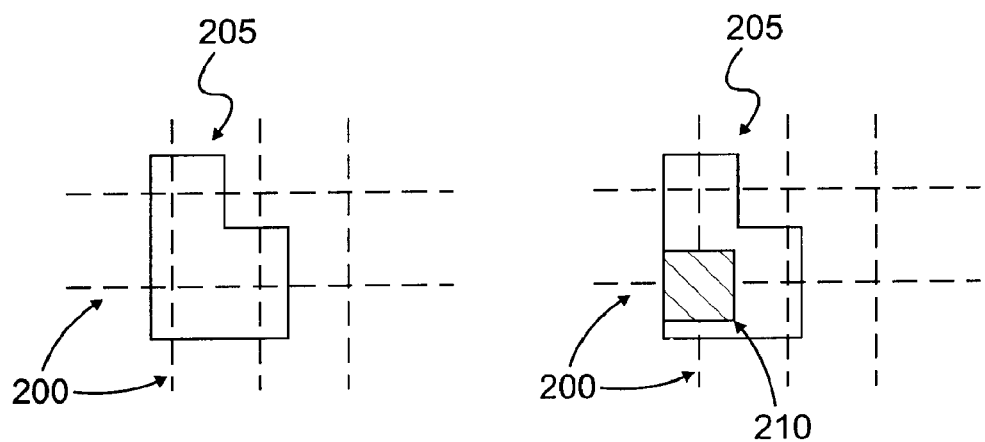
FIG. 2A, 2B schematic top views of a section of a routing grid with a possible pin area including a via.

In FIG. 2A, onto the routing grid 200 there is drawn an exemplary circuit pin area 205 that is aligned with the grid 200, i.e. in other words represents an "on-grid" IC design element or structure. The grid size, i.e. the distance between the 'dashed' lines in FIG. 2A, is equal to the width of a metal wire plus appropriate spacing between the wires. It is emphasized that gridded routers require that all the wires on any metal layer use one grid or a whole integer multiple of the grid for routing any wire.

In FIG. 2B a similar circuit pin area 205 as in FIG. 2A is drawn onto the routing grid 200 but the pin area 205 has to slightly shifted to the left in order to enable it to include a further design element, namely a via 210 in the present example. It is emphasized that the position of such a via 210, in the present embodiment, is aligned with an intersection point (coordinate) of the routing grid 200.

As already stated above, although the main advantage of grid-based routers is that they can handle very large designs and therefore current commercial routers for standard cell designs are gridded, this approach may waste real estate, for example with a wire that only needs 1.2 times the grid. As a consequence, they cannot efficiently handle variable width and spacing of wires or other structural elements of the design. In particular with the advent of 0.25 micron and below technologies, variable width and spacing is required for long wires to satisfy noise, delay, cross-talk or signal integrity issues.

In addition to the above described transformation between a non-gridded and grid-based library, there exist further scenarios where the present invention can be applied correspondingly. Only exemplarily it is referred to the already mentioned 65 nm technology based IC design process where the mentioned placement grid comprises an offset value (i.e. the distance between neighboring grid lines) of 250 nm and where the routing (wiring) grid comprises a differing offset value namely 200 nm.

As a consequence, in such a scenario the described circuit pins or pin areas (see FIGS. 2A and 2B) are typically not located on intersection points of the routing grid. In addition, most circuit pins cover an area of the mentioned 'M1' layer. Because of wiring tool runtime, the router uses the routing grid on the planes 'M2' through the topmost layer. One problem caused by this is to access off-grid pin areas from on-grid M2 coordinates. As described with FIG. 2B, this problem can be solved by finding an on-grid location within the pin area 205 where a via 210 can be disposed which connects the 'M1' layer and the 'M2' layer. It is emphasized that, as a further example of a design rule, a via 210 needs a minimum area on both planes 'M1' and 'M2'.

Turning back to FIG. 2B, it is further emphasized that none of the possible three on-grid via positions is legal because the shape of the via 210 would stick out the pin area 205. Such a circuit location is called "offending" and typically, only the x coordinate of the routing grid 200 is affected because the placement grid in y direction is already a multiple of the routing grid.

Figure 3A:
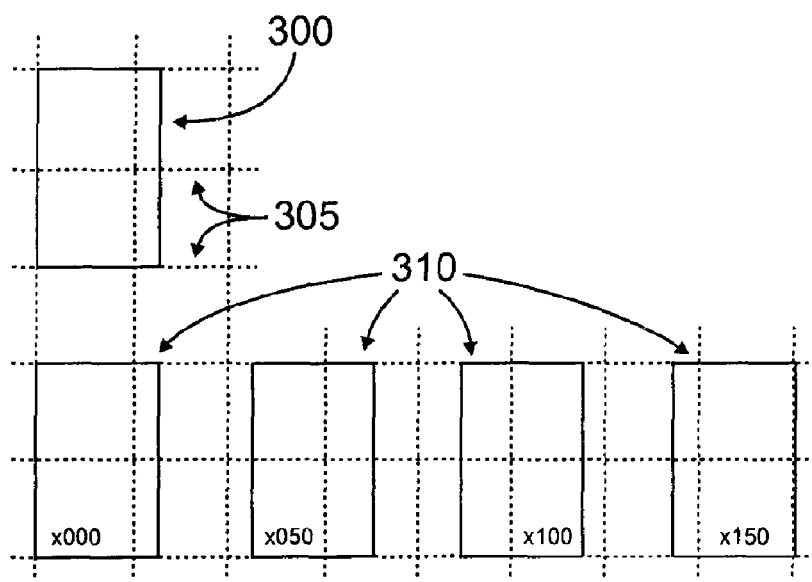
FIG. 3A, 3B schematic top views of a routing grid showing an original standard cell and four possible router cells each having a different offset in relation to the first router cell (FIG. 3A) and showing the four possible router cells together with further circuit design elements (FIG. 3B)
Figure 3B:
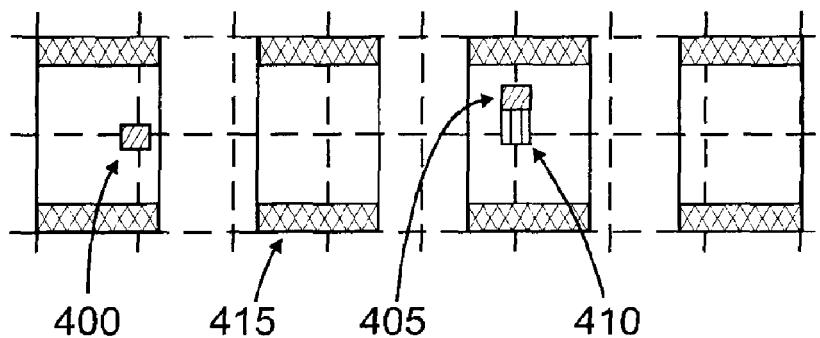

The following described FIGS. 3A and 3B both show schematic top views of a routing grid 305. As already mentioned, since the circuit pins are typically not located on wiring grid coordinates ("intersection points"), the wiring grid is chosen such that on-grid wires fulfill most layout ground rules, e.g. minimum distance of the overall wiring.

In the upper part of FIG. 3A, there is shown an original standard cell 300 wherein in the bottom part there are shown four possible router cells 310 each having a different offset value (also called 'pitch') in relation to the first router cell depicted on the left side of the bottom part. The possible offset values in the present embodiment, starting from a zero offset 'x000', are 'x050', 'x100' and 'x150'. The offset identifiers "x000" through "x150" being used here imply physical offset values of 0 nm, 50 nm, 100 nm, and 150 nm. However, these physical values are only preferred examples and can be different in other IC designs because these offset values are all existing offset values for an only exemplary combination of a placement grid having a grid width of 250 nm and a wiring grid having a grid width of 200 nm. Other combinations of placement and wiring grid typically yield different offset values and a different number of them. The term "router cell" refers to newly created library cells generated by applying this invention.

Circuit pins of a standard cell 300 are typically located on the mentioned 'M1' layer. The problem of the differing grids (placement and routing grid) only exists in the x direction. In case of the y direction, the placement grid is always a multiple of the routing grid.

FIG. 3B shows the four possible router cells depicted in FIG. 3A together with additional circuit design elements. One of these additional design elements (from the left to the right) is an on-grid circuit pin 400, i.e. a circuit pin positioned on an intersection point in x- and y-direction of the underlying routing grid.

Another additional circuit design element is a blockage area 415 caused by power wiring which is therefore not available for other design elements.

Further additional design elements are a circuit pin 405 being aligned to the x-grid but not the y-grid and a segment 410 which is located on an intersection point of the underlying routing grid in a way that the mentioned circuit pin 405 becomes connected from its off-y-grid position to an entirely on-grid location. Therefore an advantageous result of the present invention is that after having applied the proposed methodology, all via positions of all instances are located on grid positions in both x and y direction.

Figure 4:
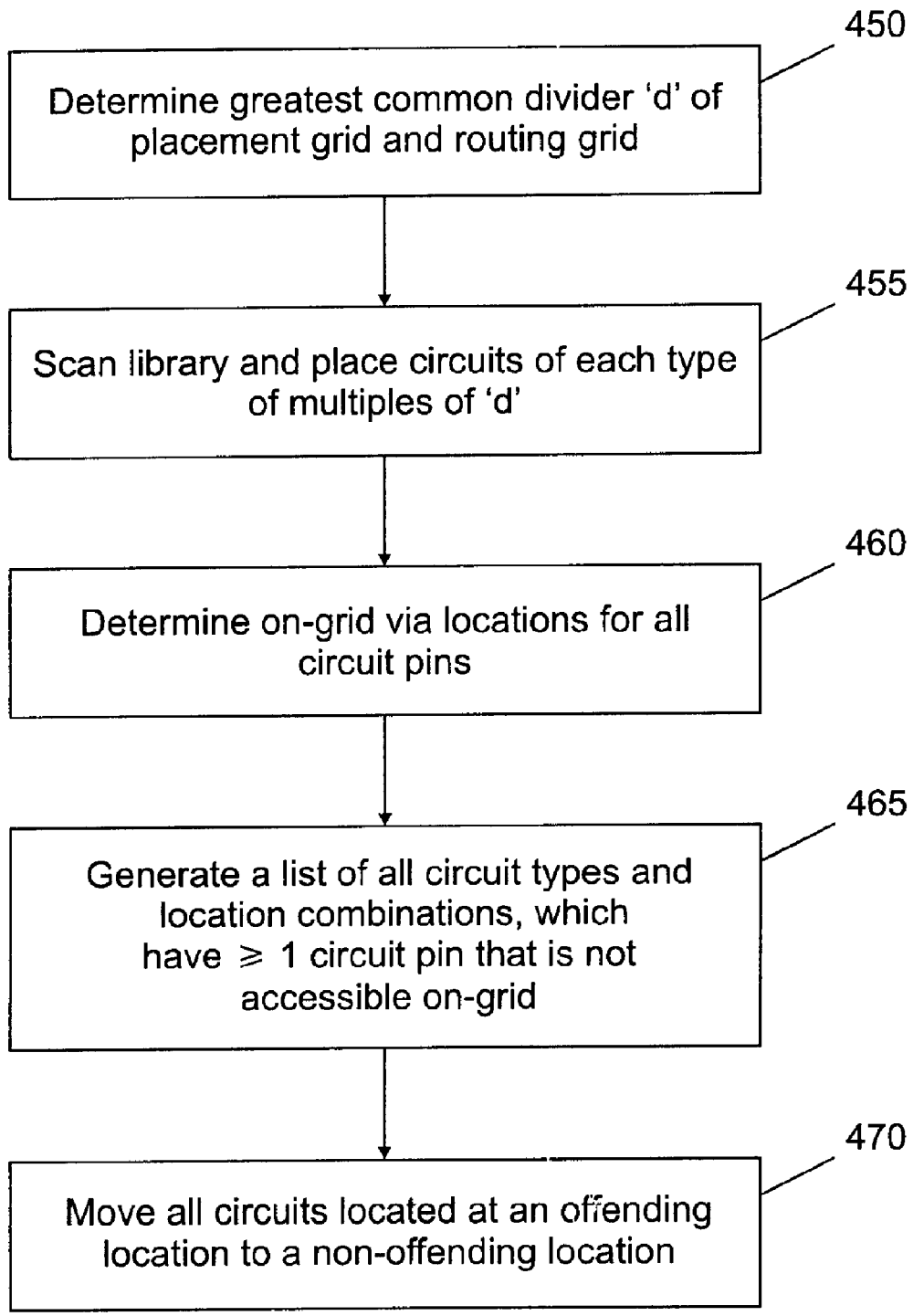
FIG. 4 depicts preferred process steps in accordance with the general concept of the present invention.

The general concept of the methodology according to the present invention is now illustrated referring to FIG. 4. The main objective is to find those circuit types in the library and the corresponding locations that create a difficult or impossible circuit pin access through an on-grid access location. According to the invention, circuits of these types will be moved to better suited locations prior to execution of the routing (wiring) procedure.

Turning now back to FIG. 4, the following are processing steps according to a preferred embodiment of the present invention in order to implement the pre-described concept:

In a first step 450, the greatest common divider d of the placement grid and the routing grid, which is 50 nm in the example illustrated in FIG. 3B, is determined, or calculated respectively. In a next step 455, the underlying library is scanned and circuits of each type of multiples of d, i.e. in the above example circuits with placement offsets 0, 50, 100 and 150 nm, are placed. In step 460, on-grid via locations for all circuit pins are determined. According to step 465, a list of all circuit types and location combinations, which have at least one circuit pin which is not accessible on an intersection point of the grid (i.e. not accessible on-grid), is generated. According to last step 470, all circuits of a placed design (in contrast to the library) located at an offending location are moved to a non-offending location, as described above.

Figure 5A:
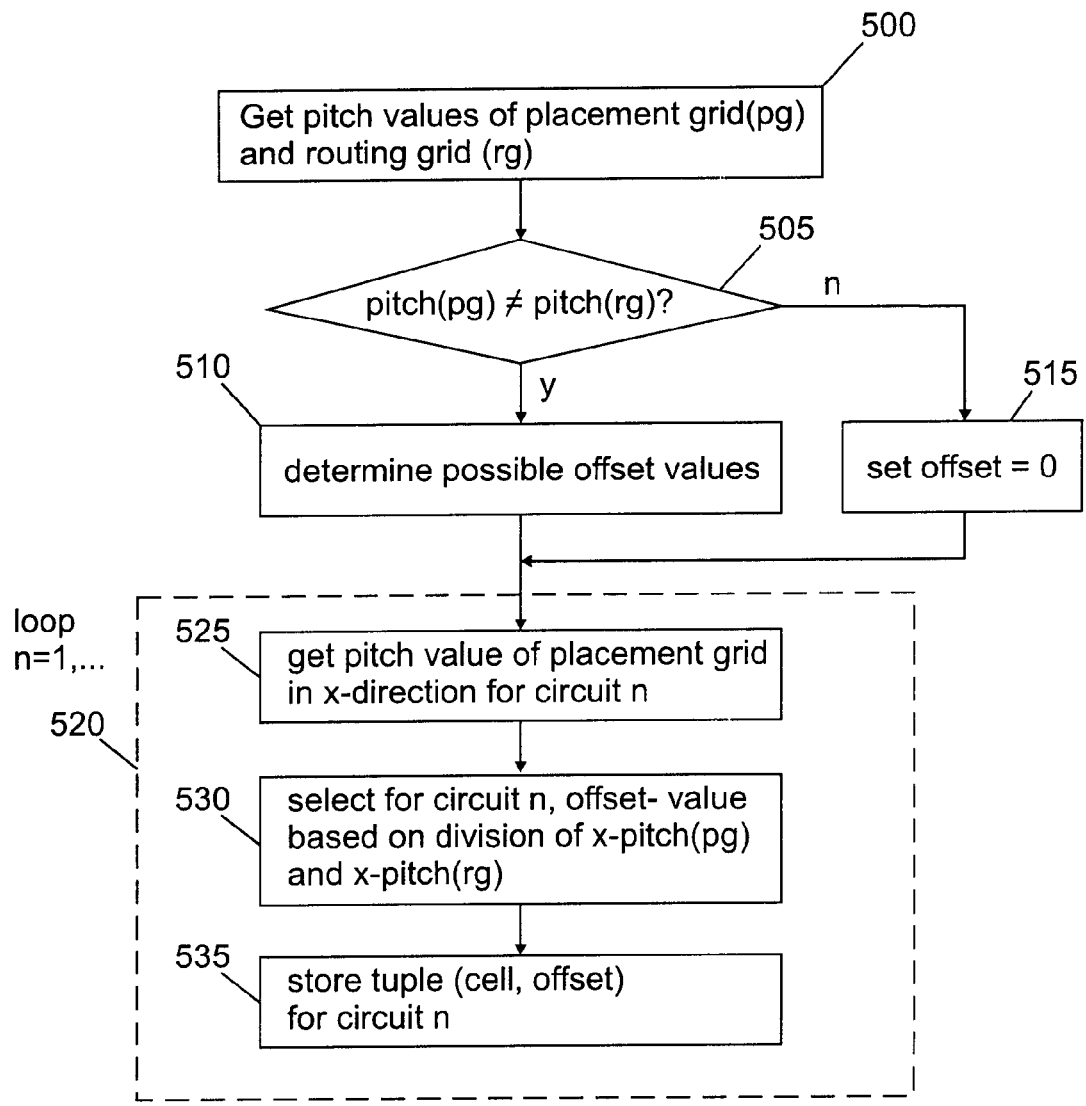
FIG. 5A, 5B a two-part flow diagram illustrating a preferred embodiment of the method for the transformation of a non-gridded library which uses standard circuit cells as books into a gridded version.
Figure 5B:
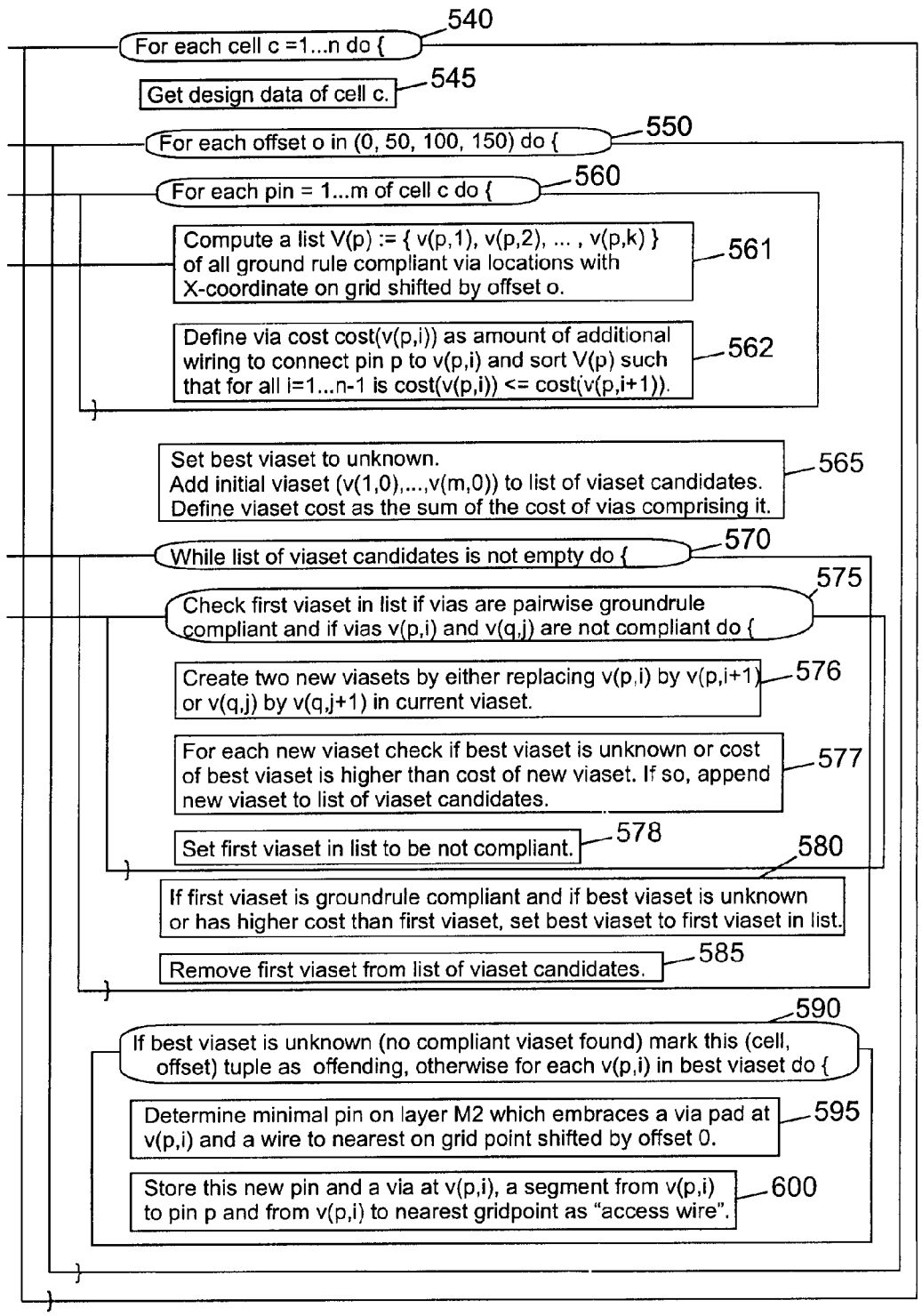

The split drawing in FIG. 5A and FIG. 5B depicts an embodiment of an automated transformation process according to the present invention for transforming a grid-less cell library into a grid-based one. It is noteworthy that the embodiment of FIGS. 5A and 5B is much more detailed than the more conceptual one depicted in FIG. 4.

In the present embodiment, it is assumed that the grid-less circuit library itself includes an own grid called "placement grid" which is also a tool to be used in the overall IC design process as it defines the on-chip interconnects which are the bottleneck in determining circuit performance. It is assumed that the placement grid and the routing grid comprise a differing offset value, i.e. one of these grids cannot be fitted into the other.

The present transformation process is based on the general assumption that the offset of the placement and routing grid is different. Therefore, according to a first step 500, the offset values of the placement grid ('pg') and the routing grid ('rg') are input or obtained. Using these two offset values, in the following step 505 it is determined if the two offset values are different or not. If the comparison step 505 reveals that they are not different, the offset is set to value '0'. If the comparison step 505 reveals that the two offset values are different, then all possible offset values between the two grids are determined 510.

Only as an implementation example, for a placement grid with an offset value of 250 nm and a routing grid with an offset value of 200 nm, the four possible offset values are 0 nm, 50 nm, 100 nm and 150 nm. In the case that the placement and the routing grid (i.e. their offset values) are identical, the offset will always be zero.

The following steps 525 to 535 represent a first loop 520 with n=1, 2, . . . , where n is designating a circuit number or counter. In step 525, the offset value of the placement grid in x-direction for a current circuit n is gathered or input. Based on the result of the division of the x-offset value of the placement grid by the x-offset value of the routing grid, for the current circuit n, an offset value is selected 530. The offset value for the current and each other circuit n included in the loop is then stored 535 as a tuple [cell, offset].

Starting with the existing placement of the circuit elements within a circuit, each circuit is assigned a unique combination of the two properties cell and corresponding offset, in the preferred embodiment using the mentioned data tuple. The offset is calculated as modulo of the division of the x-coordinates of the placement grid and the routing grid, wherein a possible reflection at the y-axis of the grid may be taken into consideration. The present loop runs on the circuits of a netlist.

The following steps 545 to 600 of the present procedure are part of a second loop 540 which counts the cell number c starting with c=1. In addition, this second loop 540 includes five additional (inner) loops starting with corresponding steps 550, 560, 570, 575 and 590. These further loops are separated from each other by the shown solid lines.

In step 545, the design data of a current cell c are gathered or input. Based on the design data of the current cell c, with step 550 a first inner loop is started where the following steps 560 to 600 are executed for each offset of the possible offset values 0, 50, 100 and 150 according to the above described preferred embodiment using counter o. With next step 560, the next inner loop is started where the following steps 561 and 562 are executed for each pin with pin counter p=1 . . . m of the current cell c.

In step 561, a list V(p) of all ground rule compliant via locations v(p,1), v(p,2), . . . , v(p,k) with X-coordinate on grid and shifted by an offset value according to the current offset counter o is computed. In the following step 562, based on these via locations v(p,1), v(p,2), . . . , v(p,k), a via cost function cost(v(p,i)) is defined as the amount of additional wiring to connect pin p to via location v(p,i). The list V(p) is then sorted in such a way that for all i=1 . . . n−1 the following condition is fulfilled:

$$\text{cost}(v(p,i)) \leq \text{cost}(v(p,i+1)).$$

The following block 565 comprises a number of steps. In a first step, a logical variable 'best viaset' of the cost function is set to the logical value 'unknown'. Then an initial viaset (v(1,0), . . . , v(m,0)) is added to the above described list of viaset candidates. The viaset cost is defined as the sum of the costs of the vias contained in the candidate list.

With step 570, the next inner loop starts where the following steps 575 to 585 included in this inner loop are only executed as long as the current list of viaset candidates is not empty. With step 575 the next inner loop starts where the following steps 576 to 578 are only executed as long as the following condition is fulfilled: The current viaset in the list is checked if the condition is fulfilled that vias are pair-wise ground rule compliant and that vias v(p,i) and v(q,j) are not compliant.

In step 576 two new viasets are created by either replacing v(p,i) by v(p,i+1) or v(q,j) by v(q,j+1) in the current viaset. For each new viaset it is then checked 577 if the logical variable 'best viaset' is set to 'unknown' or if the value of the cost function of the best viaset is higher than the cost value for the new viaset. If so, the new viaset is appended to the list of viaset candidates. At the end of the present inner loop, in step 578 of the present inner loop the first viaset in the list is assigned with the logical value 'not compliant'.

In the following step 580, it is checked whether the first viaset is ground rule compliant, and whether the logical variable 'best viaset' is set to 'unknown' or whether the best viaset is known and has a higher cost value than the first viaset. If one of the two alternative conditions is fulfilled then the first viaset in the list is assigned as 'best viaset'. The inner loop starting at step 570 is then finalized by removing 585 the first viaset from the list of viaset candidates.

At block 590, the last of the mentioned inner loops begins. It is first checked if the logical variable 'best viaset' is set to 'unknown', i.e. no ground rule compliant viaset has been revealed by the previous steps 540 to 585. In this case, the current tuple [cell, offset] is marked as 'offending'. Otherwise the following two steps 595 and 600 are executed.

In step 595 a pin with a minimal pin area located on layer M2 is determined which embraces a via pad at via location v(p,i) and a wire to the nearest on-grid (intersection) point that is shifted by an offset value according to the current offset counter o. Finally, in step 600 the newly determined pin and a via at location v(p,i), together with a segment from v(p,i) to pin p and from v(p,i) to the nearest grid point is stored as "access wire".

The use of a cost function or an objective function in solving an optimization problem in which the cost function is minimized or maximized is known in the art. Such a cost function based optimization approach seeks to minimize or maximize a real function by systematically choosing the values of real or integer variables from within an allowed set. This problem can be represented in the following way:

Given: a function f: A→R from some set A to the real numbers Sought: an element $x_0$ in A such that $f(x_0) \cdot f(x)$ for all x in A ("minimization") or such that $f(x_0) \cdot f(x)$ for all x in A ("maximization").

However, the use of such a cost function for the physical design of an IC is not known in the art. Applying such a cost function to the present field of routing interconnections in an IC design, the function f represents the total wiring interconnection length of an underlying circuit cell or book which has to be minimized but meeting the above described 'legal validity' and 'suitability' requirements of the underlying design being routed.

Typically, A is some subset of the Euclidean space $R^n$, often specified by a set of constraints, equalities or inequalities that the members of A have to satisfy. The elements of A are called feasible solutions. The function f is called an objective function, or cost function. A feasible solution that minimizes (or maximizes, if that is the goal) the objective function is called an optimal solution.

The domain A of f is called the search space, while the elements of A are called candidate solutions or feasible solutions. Generally, when the feasible region or the objective function of the problem does not present convexity, there may be several local minima and maxima, where a local minimum x* is defined as a point for which there exists some •>0 so that for all x such that $$\|x-x^*\| \leq \delta;$$

the expression $$f(x^*) \leq f(x)$$

holds, i.e. in some region around x* all of the function values are greater than or equal to the value at that point. Local maxima are defined similarly.

The above cost function can be based on a "half-perimeter" wire length computation and be used in the present context in order to model the possibility of wiring given book-offset combination. As in general, the higher the calculated costs are, the lower are the possibilities to find a wiring for the combination. As an example, combinations for which there does not exist a legally permitted viaset, the revealing costs are unlimited high. In the following step, all movable i.e. non-fixed circuits or circuit elements are moved or newly placed in a way that the total costs of both the current target function and the costs of the current book-offset combination are minimized.

An exemplary pseudo code using the above cost function in the present field is
Cost=infinity
IF tupel (cell, offset) is offending THEN provide additional M1 area OTHERWISE use present M1 area The present invention can be implemented either in a router or separate placement and wiring tools.

Furthermore, the present invention can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The invention claimed is:

1. A method for designing an integrated circuit, the method comprising:
    using a computer for providing a circuit description;
    providing a plurality of cells comprising pre-determined circuit parts, each cell having at least one circuit pin providing electrical connection from the cell to a wiring element;
    forming a placement layout of cells from said plurality of cells that represents said circuit description and satisfies pre-determined technological design rules, wherein each cell within the placement layout comprises a pin region within which said at least one circuit pin may be legally connected to a wiring element according to said technological design rules;
    providing a routing grid for designing routing paths of interconnections between cells;
    identifying an offending cell of said plurality of cells within said placement layout wherein said pin region of said offending cell does not legally align with a location on said routing grid;
    prior to performing a routing of interconnections between cells in said placement layout, moving the location of said offending cell so that said pin region of said offending cell is legally aligned with said routing grid while continuing to satisfy said technological design rules, wherein said routing grid is characterized by a routing grid spacing and said placement layout is arranged on a placement grid having a placement grid spacing that is different than said routing grid spacing, and determining a greatest common divider of said placement grid spacing and said routing grid spacing.

2. The method according to claim 1, wherein said wiring element comprises a via.

3. The method according to claim 1, wherein said moving the location of said offending cell is performing at a multiple of said greatest common divider.

4. The method according to claim 1, wherein said step of identifying an offending cell further comprises:
    identifying a plurality of possible legal offset values for the location of said offending cell so that said at least one circuit pin in said pin region may be legally connected to a wiring element according to said technological design rules; and
    selecting a best set of legal offset values from of said plurality of possible legal offset values in accordance with a wiring cost function.

5. The method according to claim 4, wherein said wiring cost function represents a total wiring interconnection length to be minimized.

6. The method according to claim 4, wherein said step of selecting a best set of legal offset values comprises solving an optimization problem to select an optimal solution from a set of feasible solutions, so that an objective function is maximized or minimized subject to a set of constraints, wherein said objective function comprises a wiring cost function, said set of constraints comprises said technological design rules, said set of feasible solutions comprises said plurality of possible offset values, and said best set of legal offset values comprises an optimal solution to said optimization problem.

7. The method according to claim 6, wherein said wiring cost function comprises a total wiring interconnection length, and said wiring cost function is to be minimized.

8. The method according to claim 6, wherein said set of feasible solutions comprises a set of offset values for locating vias on intersections in said routing grid.

9. A computer program product comprising a non-transitory computer-readable recording medium having computer-readable program code embodied therein, wherein the computer-readable program code performs the steps of:
using a computer providing a circuit description;
providing a plurality of cells comprising pre-determined circuit parts, each cell having at least one circuit pin for providing electrical connection from the cell to a wiring element;
forming a placement layout of cells from said plurality of cells that represents said circuit description and satisfies pre-determined technological design rules, wherein each cell within the placement layout comprises a pin region within which said at least one circuit pin may be legally connected to a wiring element according to said technological design rules;
providing a routing grid for designing routing paths of interconnections between cells;
identifying an offending cell of said plurality of cells within said placement layout wherein said pin region of said offending cell does not legally align with a location on said routing grid;
prior to performing a routing of interconnections between cells in said placement layout, moving the location of said offending cell so that said pin region of said offending cell is legally aligned with said routing grid while continuing to satisfy said technological design rules, wherein said routing grid is characterized by a routing grid spacing and said placement layout is arranged on a placement grid having a placement grid spacing that is different than said routing grid spacing, and determining a greatest common divider of said placement grid spacing and said routing grid spacing.

10. The computer program product according to claim 9, wherein said wiring element comprises a via.

11. The computer program product according to claim 9, wherein said moving the location of said offending cell is performing at a multiple of said greatest common divider.

12. The computer program product according to claim 9, wherein said step of identifying an offending cell further comprises:
identifying a plurality of possible legal offset values for the location of said offending cell so that said at least one circuit pin in said pin region may be legally connected to a wiring element according to said technological design rules; and
selecting a best set of legal offset values from of said plurality of possible legal offset values in accordance with a wiring cost function.

13. The computer program product according to claim 12, wherein said wiring cost function represents a total wiring interconnection length to be minimized.

14. The computer program product according to claim 12, wherein said step of selecting a best set of legal offset values comprises solving an optimization problem to select an optimal solution from a set of feasible solutions, so that an objective function is maximized or minimized subject to a set of constraints, wherein said objective function comprises a wiring cost function, said set of constraints comprises said technological design rules, said set of feasible solutions comprises said plurality of possible offset values, and said best set of legal offset values comprises an optimal solution to said optimization problem.

15. The computer program product according to claim 14, wherein said wiring cost function comprises a total wiring interconnection length, and said wiring cost function is to be minimized.

16. The computer program product according to claim 14, wherein said set of feasible solutions comprises a set of offset values for locating vias on intersections in said routing grid.

* * * * *